United States Patent [19]

Mitsunobu

[11] Patent Number: 4,837,505
[45] Date of Patent: Jun. 6, 1989

[54] TEST MODE ACTIVATION CIRCUIT
[75] Inventor: Takamasa Mitsunobu, Toyonaka, Japan
[73] Assignee: Ricoh Company, Ltd., Tokyo, Japan
[21] Appl. No.: 931,676
[22] Filed: Nov. 17, 1986
[30] Foreign Application Priority Data
Nov. 20, 1985 [JP] Japan .................. 60-262235
[51] Int. Cl.$^4$ .............. G01R 31/00; H03K 17/56
[52] U.S. Cl. .............. 324/158 R; 324/73 R; 307/241; 307/242
[58] Field of Search .............. 324/96, 73 R, 158 R; 371/27; 307/242, 241, 350; 328/152, 103; 365/201

[56] References Cited
U.S. PATENT DOCUMENTS
2,556,200  6/1951  Lesti ..................... 307/242
3,805,171  4/1974  Drumheller ............... 328/152

Primary Examiner—Reinhard J. Eisenzopf
Assistant Examiner—Vinh P. Nguyen
Attorney, Agent, or Firm—Cooper & Dunham

[57] ABSTRACT

A test mode activation circuit preferably defined as part of a semiconductor integrated circuit device, such as ROM, has a two-stage structure. The first stage has a first input terminal and a plurality of first output terminals, the voltage of each of which is uniquely determined depending on the voltage level of an input signal applied to the first input terminal. The second stage has a plurality of second input terminals, which are selectively connectable to the plurality of first output terminals, and a second output terminal for outputting a test mode activation signal. A logic function between the second input and output terminals is uniquely determined by an electrical connection pattern between the first and second stages. Thus, only when an input signal having a particular sequential voltage variation pattern is applied to the first input terminal, the test mode activation signal is output from the second output terminal.

11 Claims, 3 Drawing Sheets

TEST MODE ACTIVATION CIRCUIT

BACKGROUND OF THE INVENTION

1. Field of the Invention

This invention generally relates to a semiconductor circuit, and, in particular, to a semiconductor integrated circuit, such as LSI, provided with a test mode activation circuit.

2. Description of the Prior Art

A semiconductor circuit typically includes a particular input terminal to which a voltage having a predetermined level is applied to establish a test mode condition. For this reason, it is relatively easy to establish a test mode; however, there is a possibility of inspecting the internal information which can be observed externally only when the test mode is established. In particular, in a one-chip microcomputer including a ROM whose program may be damped during test mode, the program may be read out by setting the test mode quite easily. This is disadvantageous because the program stored in the ROM is easily accessible.

SUMMARY OF THE INVENTION

In accordance with the present invention, there is provided a test mode activation circuit comprising: first means including a first input terminal and a first plurality of first output terminals, said first means determining a voltage level of each of said first plurality of first output terminals depending on a level of an input signal applied to said first input terminal; and second means including a second plurality of second input terminals and a second output terminal, at least one of said second plurality of second input means being electrically connectable to at least one of said first plurality of first output terminals, whereby a test mode activation signal appears at said second output terminal when said input signal is applied to said first input terminal.

In the preferred embodiment, the first means includes first voltage level detecting means for detecting a first voltage level and second voltage level detecting means for detecting a second voltage level which is different from the first voltage level. In one embodiment, the first voltage level is a normal voltage level typically used in the semiconductor technology, such as 5 V, and the second voltage level is higher than the first voltage level. More specifically, the first voltage level detecting means includes an inverter. In one embodiment, the first means includes three first output terminals, one of which is connected to the first input terminal through the first voltage level detecting means, another of which is directly connected to the first input terminal, and the other of which is connected to the first input terminal through the second voltage level detecting means.

Preferably, the second means includes a plurality of latching means connected in series and each of the plurality of latching means has at least one of said second plurality of second input means. In one embodiment, each of the plurality of latching means includes a flip-flop. In one embodiment, the first plurality of output terminals and the second plurality of input terminals are electrically connected in a desired manner by metallization using a mask. The test mode activation circuit of the present invention is advantageously integrally defined as part of a semiconductor integrated circuit, such as a ROM.

It is therefore a primary object of the present invention to obviate the disadvantages of the prior art as described above and to provide an improved semiconductor device.

Another object of the present invention is to provide a test mode activation circuit suitable for being provided as part of a semiconductor integrated circuit device.

A further object of the present invention is to provide a test mode activation circuit which allows to establish a test mode of operation only when an input signal having a predetermined sequential voltage pattern is applied.

A still further object of the present invention is to provide a test mode activation circuit which allows a user to define a desired sequential voltage pattern to be used as an input signal to activate a test mode of operation, thereby preventing an unauthorized user from establishing the test mode of operation.

Other objects, advantages and novel features of the present invention will become apparent from the following detailed description of the invention when considered in conjunction with the accompanying drawings.

DESCRIPTION OF THE PREFERRED EMBODIMENTS

Figure 1:
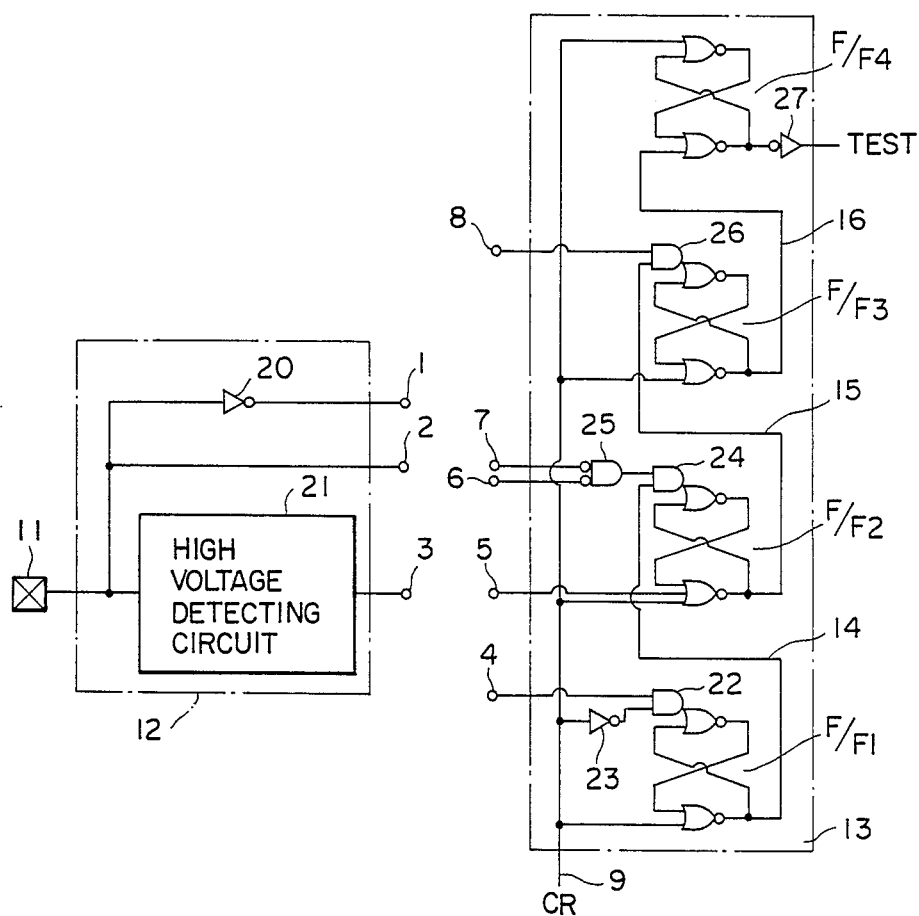
FIG. 1 a schematic illustration showing a test mode activation circuit constructed in accordance with one of the present invention.

Referring now to FIG. 1, there is schematically shown a test mode activation circuit constructed in accordance with one embodiment of the present invention. In the illustrated embodiment, the test mode activation circuit has a two-stage structure: a first stage 12 and a second stage 13. The first stage 12 includes a first input terminal 11 and three first output terminals 1 through 3. The first input terminal 11 receives an input signal and the voltage level of each of the three first output terminals is determined depending on the voltage level of the input signal applied to the first input terminal 11. The first stage 12 further includes an inverter 20 having its input end connected to the first input terminal 11 and its output end connected to one 1 of the three first output terminals. In the present embodiment, the inverter 20 becomes operable when the voltage at its input end becomes a normal power supply voltage, or high level voltage, such as 5 V. In the illustrated embodiment, the second 2 of the three first output terminals is directly connected to the first input terminal 11. In addition, the remaining 3 of the three first output terminals is connected from the first input terminal 11 through a high voltage detecting circuit 21. In the present embodiment, the voltage detecting circuit 21 is so structured to supply a high level (5 V) output when a higher voltage $V_{pp}$, which is higher than 5 V and often used as a programming voltage in a programmable semiconductor device such as PROM, is input.

With this structure, when a high level input signal is applied to the first input terminal 11, the first output terminals 1 through 3 are set at low level (0 V), high level (5 V) and low level (0 V), respectively. On the other hand, if a low level input signal is applied to the first input terminal 11, then the first output terminals 1 through 3 are set at high level (5 V), low level (0 V) and low level (0 V), respectively. In addition, if a higher voltage $V_{pp}$ is applied to the first input terminal 11, then the first output terminals 1 through 3 are set at low level (0 V), $V_{pp}$ level and high level (5 V). In this manner, the voltage level of each of the three first output terminals 1 through 3 is uniquely determined depending on the voltage level of an input signal applied to the first input terminal 11.

In the illustrated embodiment, the second stage 13 includes five second input terminals 4 through 8 and a second output terminal for supplying a test mode activation output signal TEST, which may be set either at low level or at high level. In the present embodiment, when the TEST signal is set at high level, a test mode of operation is activated. At least one of the five second input terminals 4 through 8 may be electrically connected to at least one of the three first output terminals 1 through 3. And, such an electrical connection between the first and second stages 12 and 13 may be preferably carried out by metallization using user-defined mask or by using underpath diffusion regions. It is to be noted, however, that, in the illustrated embodiment, an electrical connection must be always provided between the output terminal 3 and the input terminal 4.

In the illustrated embodiment, the second stage 13 includes four flip-flops F/F1 through F/F4 which are connected in series. The second stage 13 also includes an AND gate 22 which has its output connected to a set input of a first flip-flop F/F1, its one input connected to the second input terminal 4, and its other input connected to a test mode clear line 9 through an inverter 23. A test mode clear signal CR for clearing the test mode of operation is carried along the test mode clear line 9. The first flip-flop F/F1 has its reset input connected to the test mode clear line 9. Thus, an output 14 from the first flip-flop F/F1 is set to become high level when a high level signal is applied to the second input terminal 4; on the other hand, the output 14 is set to become low level when the test mode clear signal CR is applied.

The second stage 13 further includes an NAND gate 25 which has its pair of inputs connected to the respective second input terminals 6 and 7, respectively, and its output connected to one input of an AND gate 24 which has its other input connected to the output of the first flip-flop F/F1 and its output connected to a set input of a second flip-flop F/F2. The second flip-flop F/F2 has its reset input connected to the test mode clear line 9 and also to the second input terminal 5. With this structure, an output 15 from the second flip-flop F/F2 is set if both of the second input terminals 6 and 7 are at low level with the output 14 from the first flip-flop F/F1 being at high level; on the other hand, the output 15 is reset when the clear signal CR is applied or a high level signal is applied to the second input terminal 5.

The second stage 13 further includes an AND gate 26 which has its output connected to a set input of a third flip-flop F/F3, its one input connected to the remaining second input terminal 8 and its other input connected to the output 15 of the second flip-flop F/F2. The third flip-flop F/F3 has its reset input connected to the test mode clear line 9. With this structure, an output 16 of the third flip-flop F/F3 is set if a high level signal is applied to the second input terminal 8 with the output 15 from the second flip-flop F/F2 being at high level; whereas, the output 16 is reset or cleared by the clear signal CR. The second stage 13 also includes a fourth flip-flop F/F4 which has its set input connected to the output 16 of the third flip-flop F/F3 and its reset input connected to the test mode clear line 9. Also provided in the second stage 13 is an inverter 27 which is connected to an output of the fourth flip-flop F/F4, so that the test mode activation signal TEST is supplied as an output of the present circuit through the inverter 27. It is to be noted that the test mode activation signal TEST is set when the output 16 from the third flip-flop F/F3 becomes high level and cleared when the clear signal CR is applied.

Figure 2:
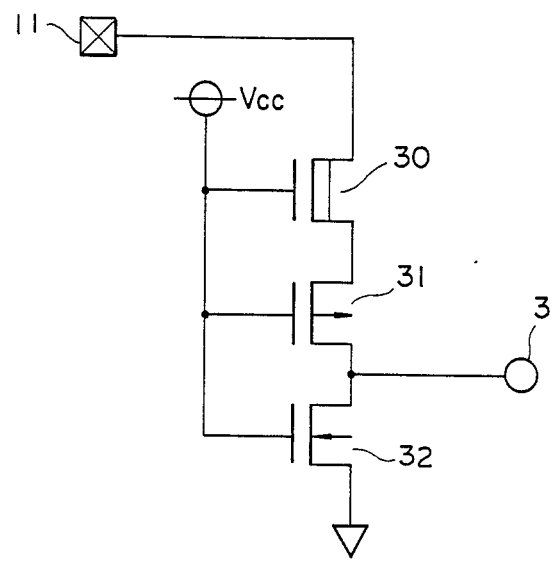
FIG. 2 is a circuit diagram showing one example of a high voltage detecting circuit suitable for use in the test mode activation circuit shown in FIG. 1.

FIG. 2 shows the detailed structure of one example of the high voltage detecting circuit 21 for use in the present test mode activation circuit, though the present invention should not be limited only to the use of the high voltage detecting circuit 21 shown in FIG. 2. The illustrated embodiment is constructed by employing a CMOS structure. As shown, the illustrated high voltage detecting circuit 21 includes a depletion mode MOSFET 30, a P-channel MOSFET 31 and an N-channel MOSFET 32, which are connected in series between the first input terminal 11 and ground. Each of the three MOSFETs 30 through 32 has its gate connected commonly to a power supply voltage $V_{cc}$, which is typically 5 V. A node between the MOSFETs 31 and 32 is connected to the first output terminal 3. With this structure, when a high level signal (5 V) is applied to the first input terminal 11, the P-channel MOSFET 31 is turned off because the gate of the P-channel MOSFET 31 is at 5 V and its source is at a voltage less than 5 V. As a result, the voltage at the first output terminal 3 becomes low level. On the other hand, if the higher voltage $V_{pp}$, e.g., 21 V, is applied to the first input terminal 11, the P-channel MOSFET 31 is turned on, so that the voltage at the first output terminal 3 becomes high level.

FIGS. 3A through 3D show four possible electrical connections established between the three first output terminals 1 through 3 of the first stage 12 and the five second input terminals 4 through 8 of the second stage 13. It should be understood that in each of these figures, fat black lines indicate the presence of electrical connections between the white dots indicating input or output terminals. FIGS. 4A through 4D each show a particular input signal having a particular sequential voltage pattern to be applied to the first input terminal 11 so as to produce the test mode activation signal TEST for the corresponding wiring established between the first output and second input terminals.

Figure 3A:
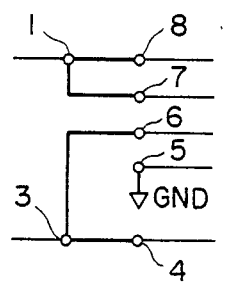
FIGS. 3A through 3D are four possible connection conditions between a first stage and a second stage of the test mode act circuit.

In the case of FIG. 3A, the first output terminal 3 is electrically connected to both of the second input terminals 4 and 6. Similarly, the first output terminal 1 is electrically connected to both of the second input terminals 7 and 8. The remaining second input terminal 5 is connected to ground. As mentioned before, in the illustrated embodiment, the first output and second input terminals 3 and 4 must be electrically connected in each case because the input voltage to set the first flip-flop F/F1 needs to be set at $V_{pp}$.

Figure 3B:
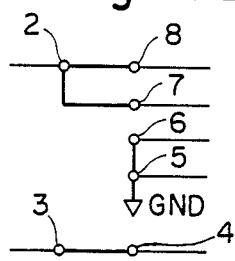
Figure 4A:
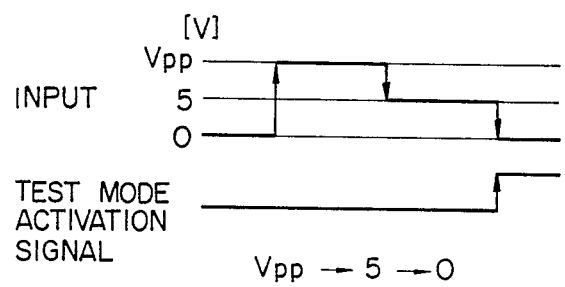
FIGS. 4A through 4D are timing diagrams which are useful for understanding the operation of the present test mode activation circuit when connected as shown in FIGS. 3A through 3D, respectively.
Figure 4B:
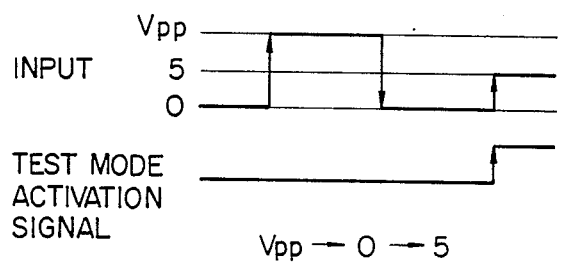
Figure 3C:
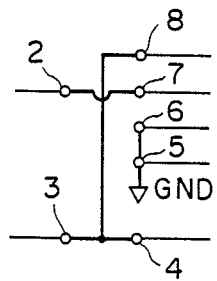
Figure 4C:
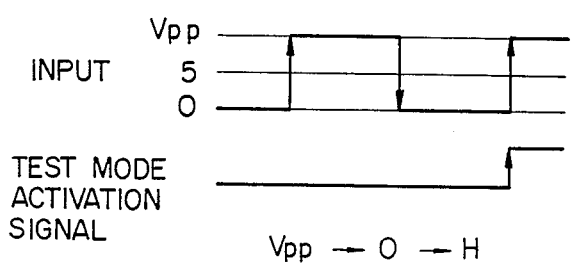
Figure 3D:
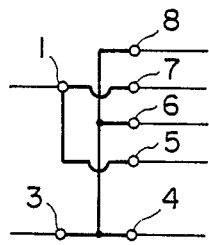
Figure 4D:
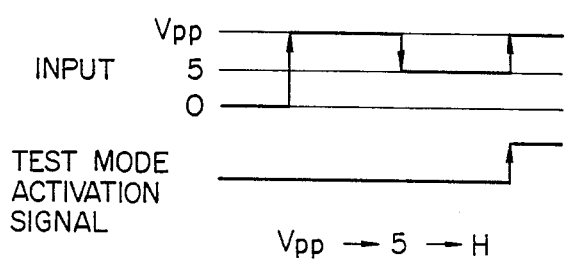

As shown in FIG. 4A, when the voltage level of the input signal applied to the first input terminal 11 is first set at $V_{pp}$, the output 14 of the first flip-flop F/F1 becomes high level. Next, the input signal applied to the first input terminal 11 is set at high level (5 V), which causes both of the first output terminals 1 and 3 to become low level. And, thus, both of the second input terminals 6 and 7 are set at low level, which then causes the second flip-flop F/F2 to be set, thereby rendering the output 15 to be high level. In succession, when the input signal applied to the first input terminal 11 is set at low level (0 V), the voltage at the first output terminal 1 is set at high level, so that the voltage at the second input terminal 8 is set at high level, which causes the third flip-flop F/F3 to be set, thereby rendering the output 16 to be high level. Thus, the test mode activation signal TEST supplied from the fourth flip-flop F/F4 become high level, thereby activating a test mode of operation. Similarly, in the case where the first output and second input terminals are connected as shown in FIGS. 3B through 3D, the application of an input signal having a sequential voltage pattern as shown in FIGS. 4B though 4D, respectively, to the first input terminal 11 will cause activation of a test mode. In other words, in accordance with the present invention, a test mode is activated only when an input signal having a particular sequential voltage variation pattern is applied to a test mode input terminal. And, the particular pattern may be defined arbitrarily by a user by determining an electrical connection pattern between the first and second stages 12 and 13 appropriately.

It may be noticed that in the above-described embodiment, since the second stage 13 includes four serially connected flip-flops, there can be four possible combinations in the order of application of voltages. It should be noted that the second stage 13 may include any desired number of flip-flops depending on the desired complexity in designing the sequential voltage pattern of an input signal to be applied to the test input terminal 11.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A test mode activation circuit comprising:
   first means including a first input terminal and a first plurality of first output terminals, said first means determining a voltage level of each of said first plurality of first output terminals depending on a level of an input signal applied to said first input terminal, said first means including an inverter connected between said first input terminal and one of said first plurality of first output terminals, said inverter being operable at first high level voltage; and
   second means including a second plurality of second input terminals and a second output terminal, at least one of said second plurality of second input terminals being electrically connectable to at least one of said first plurality of first output terminals, whereby a test mode activation signal appears at said second output terminal when said input signal is applied to said first input terminal.

2. The circuit of claim 1 wherein said input signal has a predetermined sequential voltage variation pattern.

3. The circuit of claim 2 wherein said pattern has at least three different voltage levels.

4. The circuit of claim 3 wherein said three different voltage levels include a low level, a high level which is higher than the low level and a higher level which is higher than the high level.

5. The circuit of claim 3 wherein said low, high and higher levels correspond to 0 V, 5 V and $V_{pp}$, respectively.

6. The circuit of claim 1 wherein said first means further includes a high voltage detecting means connected between said first input and another of said first plurality of first output terminals, said high voltage detecting means being operable at second high level voltage which is higher than said first high level voltage.

7. The circuit of claim 6, wherein said high voltage detecting means includes three MOSFETs connected in series between said first input terminal and a first reference voltage, each of said three MOSFETs having its gate commonly connected to a second reference voltage, and a node between two of said three MOSFETs excepting the one connected to said first input terminal being connected to one of said first plurality of first output terminals.

8. The circuit of claim 7 wherein the MOSFET connected to said first input terminal is a depletion mode MOSFET and the remaining two MOSFETs define a CMOS inverter.

9. The circuit of claim 7 wherein said first reference voltage is a power supply voltage and said second reference voltage is ground voltage.

10. A test mode activation circuit comprising:
    first means including a first input terminal and a first plurality of first output terminals, said first means determining a voltage level of each of said first plurality of first output terminals depending on a level of an input signal applied to said first input terminal; and
    second means including a second plurality of second input terminals and a second output terminal, at least one of said second plurality of second input terminals being electrically connectable to at least one of said first plurality of first output terminals, whereby a test mode activation signal appears at said second output terminal when said input signal is applied to said first input terminal, said second means including a plurality of latching means connected in series, at least one of said plurality of latching means having an input which is connected to at least one of said second plurality of second input terminals.

11. The circuit of claim 10 wherein each of said plurality of latching means includes a flip-flop.

* * * * *